United States Patent [19]
Cunningham et al.

[11] Patent Number: 6,079,044
[45] Date of Patent: Jun. 20, 2000

[54] METHOD AND ERROR CORRECTING CODE (ECC) APPARATUS FOR STORING PREDEFINED INFORMATION WITH ECC IN A DIRECT ACCESS STORAGE DEVICE

[75] Inventors: Earl Albert Cunningham; Richard Greenberg; Michael J. Shea, all of Rochester, Minn.

[73] Assignee: International Business Machines Corporation, Armonk, N.Y.

[21] Appl. No.: 08/892,244

[22] Filed: Jul. 14, 1997

Related U.S. Application Data

[63] Continuation of application No. 08/469,657, Jun. 6, 1995, abandoned.

[51] Int. Cl.[7] ................................................. G11C 29/00
[52] U.S. Cl. ..................... 714/763; 714/752; 714/757; 714/761; 714/767; 714/768; 714/769; 714/770; 714/772; 714/773
[58] Field of Search .................................. 371/37.1, 37.6, 371/38.1, 39.1, 40.1, 40.4, 40.11, 40.12, 40.13, 40.14, 40.15, 40.16, 40.18

[56] References Cited

U.S. PATENT DOCUMENTS

| | | |
|---|---|---|
| 4,238,852 | 12/1980 | Iga et al. . |
| 4,494,234 | 1/1985 | Patel . |
| 4,525,838 | 7/1985 | Patel . |
| 4,703,485 | 10/1987 | Patel . |
| 4,706,250 | 11/1987 | Patel . |
| 4,730,321 | 3/1988 | Machado .................................. 714/756 |
| 4,910,736 | 3/1990 | Tanaka et al. . |
| 5,157,670 | 10/1992 | Kowal ..................................... 714/769 |
| 5,172,381 | 12/1992 | Karp et al. . |
| 5,375,127 | 12/1994 | Leak et al. ............................... 714/772 |
| 5,404,361 | 4/1995 | Casorso et al. ......................... 714/767 |
| 5,428,630 | 6/1995 | Weng et al. ............................. 714/763 |
| 5,446,877 | 8/1995 | Liu et al. ..................................... 714/1 |

FOREIGN PATENT DOCUMENTS

| | | |
|---|---|---|
| 0272917 | 6/1988 | European Pat. Off. . |
| 0522750A2 | 6/1992 | European Pat. Off. . |

OTHER PUBLICATIONS

European Search Report for corresponding European patent application Serial No. 96480064.3.

Hodges & Schwarz, Pseudo–Random Recording Channel, Nov. 1975, IBM Technical Disclosure Bulletin.

Hetzler, Introducing the No–ID Sector Formal, May 1994, IBM.

*Primary Examiner*—William Grant
*Assistant Examiner*—McDieanel Marc
*Attorney, Agent, or Firm*—Joan Pennington

[57] ABSTRACT

Apparatus and methods for storing predefined information with error correcting code (ECC) in a direct access storage device are provided. Predetermined information is identified and loaded to an ECC generator for customer data to be read and written. The identified predetermined information includes an address for customer data to be read and written. The customer data is written and loaded in parallel to the ECC generator. Then the generated ECC that reflects the pre-loaded predetermined information is written at the end of the written customer data. The customer data and ECC is read and loaded in parallel to the ECC generator. Errors in the predetermined information that is not written to the disk surface, can be detected from the read ECC.

12 Claims, 6 Drawing Sheets

METHOD AND ERROR CORRECTING CODE (ECC) APPARATUS FOR STORING PREDEFINED INFORMATION WITH ECC IN A DIRECT ACCESS STORAGE DEVICE

This application is a continuation of application Ser. No. 08/469,657 filed Jun. 6, 1995, now abandoned.

FIELD OF THE INVENTION

The present invention relates to a direct access storage device (DASD), and more particularly to a method and apparatus for storing predefined information with error correcting code (ECC) in a direct access storage device.

DESCRIPTION OF THE PRIOR ART

Disk drive units incorporating stacked, commonly rotated rigid magnetic disks are used for storage of data in magnetic form on the disk surfaces. Data is recorded in radially spaced data information tracks arrayed on the surfaces of the disks. Transducer heads driven in a path toward and away from the drive axis write data to the disks and read data from the disks.

In direct access storage devices (DASDs), it is necessary to position the transducer heads over data tracks on the disk surfaces to properly record and retrieve data. Typically this is accomplished by providing servo information on one or more disk surfaces for reading by the transducer heads. In a fixed block architecture (FBA) each data information track is divided into a predetermined number of equal-sized sectors. Each data sector typically has an identification (ID) field associated with it. The ID field contains information which identifies the data sector, and other information, such as flags to indicate defective sectors. Typically an addressing scheme is used where the data sectors are identified to the host system by a logical block number (LBN). The host computer sends a list of logical block numbers to be written or read. The disk drive controller converts the LBNs into zone, cylinder, head and sector (ZCHS) values. The servo system seeks to the desired zone, cylinder and head, and the disk drive begins reading ID fields until a match is found. Once the appropriate ID field has been read, the disk drive then reads or writes the following data field.

The assignee of the present application has provided a sector format that eliminates ID fields, referred to as the No-ID sector format. In the No-ID sector format, the servo system is used to locate physical sectors, and a defect map is stored in solid state random access memory (RAM) to identify logical sectors. The disk data controller converts logical block numbers to physical block numbers. The servo system is used to locate the physical sector, based upon knowledge of the track formats in each zone. This information includes the locations of any data field splits due to embedded servo, which are also stored in RAM. Both the header and data field split information are stored in RAM, not on the disk.

In applications where data is written onto a magnetic medium in parallel tracks it is possible to write one track close enough to an adjacent track such that the data on the adjacent track is significantly erased. In this situation the system will attempt to read the data and the remaining data track may not be under the head for some particular read. The system then proceeds to a data recovery procedure (DRP). This includes rereads at off-track positions, that are intended to find the remaining data track, so a read can be successfully completed. Since there is no knowledge on which off-track direction to pick first, the head may be shifted in the wrong direction. As a result, it is possible for an magneto-resistive (MR) head to be positioned over the edge of the adjacent track that has been written inwardly toward the track of interest. Even though the head has been shifted off a ways, it can still read the Identification field, and then read the adjacent track squeezed information without identifying an error. When this happens the incorrect data block will be returned to the system with no error flagged. This case of passing incorrect data off as the correct data is significantly worse than a Hard Error, where the data is not able to be read. This type of error is made much more probable with a write wide and read narrow scheme using magneto-resistive (MR) heads.

One solution to this problem is to append ID information to the customer data block that identifies the block. This ID information would be redundant to information the system already has about the customer data block. The problem with this solution is that ID fields can occupy up to 10% of a track, disk space that would otherwise be used to store customer data.

A need exists to protect the customer from receiving the wrong data undetected, in all cases. It is desirable to store the identification type information with the data block without occupying any disk space.

SUMMARY OF THE INVENTION

A principal object of the present invention is to provide an improved method and apparatus for storing predefined information with error correcting code (ECC) in a direct access storage device. Other objects are to provide such method and apparatus for storing predefined information with ECC substantially without negative effects, and that overcome many of the disadvantages of prior art arrangements.

In brief, apparatus and methods for storing predefined information with error correcting code (ECC) in a direct access storage device are provided. Predetermined information is identified and loaded to an ECC generator for customer data to be read and written. The identified predetermined information includes an address for customer data to be read and written. The customer data is written and loaded in parallel to the ECC generator. Then the generated ECC that reflects the pre-loaded predetermined information is written at the end of the written customer data. The customer data and ECC is read and loaded in parallel to the ECC generator. Errors in the predetermined information that is not written to the disk surface can be detected from the read ECC.

A feature of the invention is that the use of the hidden bytes of predetermined information stored with the ECC does cost any loss of data storage capacity of the data storage disk file.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
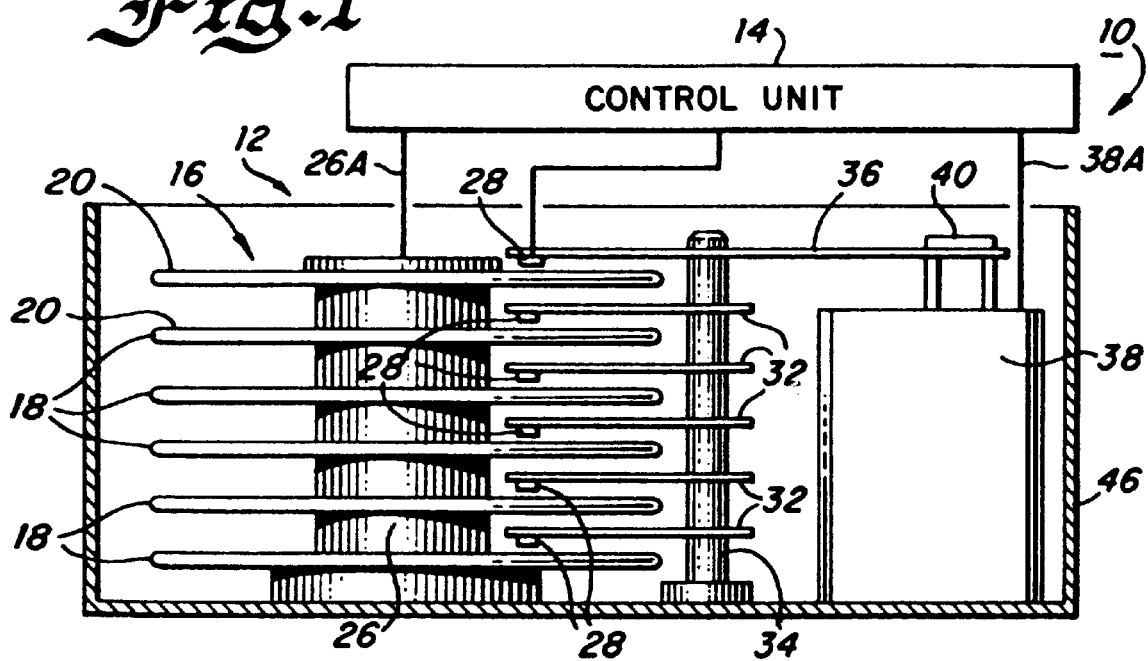
FIG. 1 is a schematic and block diagram of a data storage disk file embodying the present invention.

In FIG. 1 there is shown a partly schematic block diagram of parts of a data storage disk file 10 including a data storage medium generally designated as 12 and an interface control unit generally designated as 14. In the preferred embodiment of this invention, the data storage medium 12 is embodied in a rigid magnetic disk drive unit 12, although other mechanically moving memory configurations may be used. Unit 12 is illustrated in simplified form sufficient for an understanding of the present invention because the utility of the present invention is not limited to the details of a particular drive unit construction.

Figure 2:
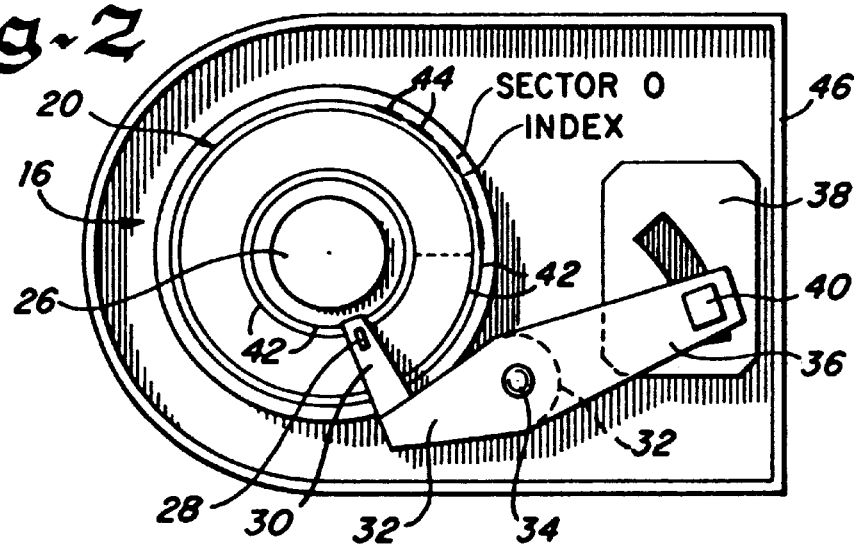
FIG. 2 is a diagram showing the accessing mechanism for a single disk surface of the apparatus of FIG. 1.

Referring now to FIGS. 1 and 2 of the drawings, disk drive unit 12 includes a stack 16 of disks 18 having at least one magnetic surface 20. The disks 18 are mounted in parallel for simultaneous rotation on and by an integrated spindle and motor assembly 26. Data information on each disk 18 are read and/or written to by a corresponding transducer head 28 movable across the disk surface 20.

Transducer heads 28 are mounted on flexure springs 30 carried by arms 32 ganged together for simultaneous pivotal movement about a support spindle 34. One of the arms 32 includes an extension 36 driven in a pivotal motion by a head drive motor 38. Although several drive arrangements are commonly used, the motor 38 can include a voice coil motor 39 cooperating with a magnet and core assembly (not seen) operatively controlled for moving the transducer heads 28 in synchronism in a radial direction in order to position the heads in registration with data cylinders to be followed. The VCM is movable within a fixed magnetic field, and the direction and velocity is controlled by the current supplied. The various components of the disk file 10 are controlled in operation by signals generated by control unit 14 such as motor control signals on line 26A and position control signals on line 38A.

Figure 7:
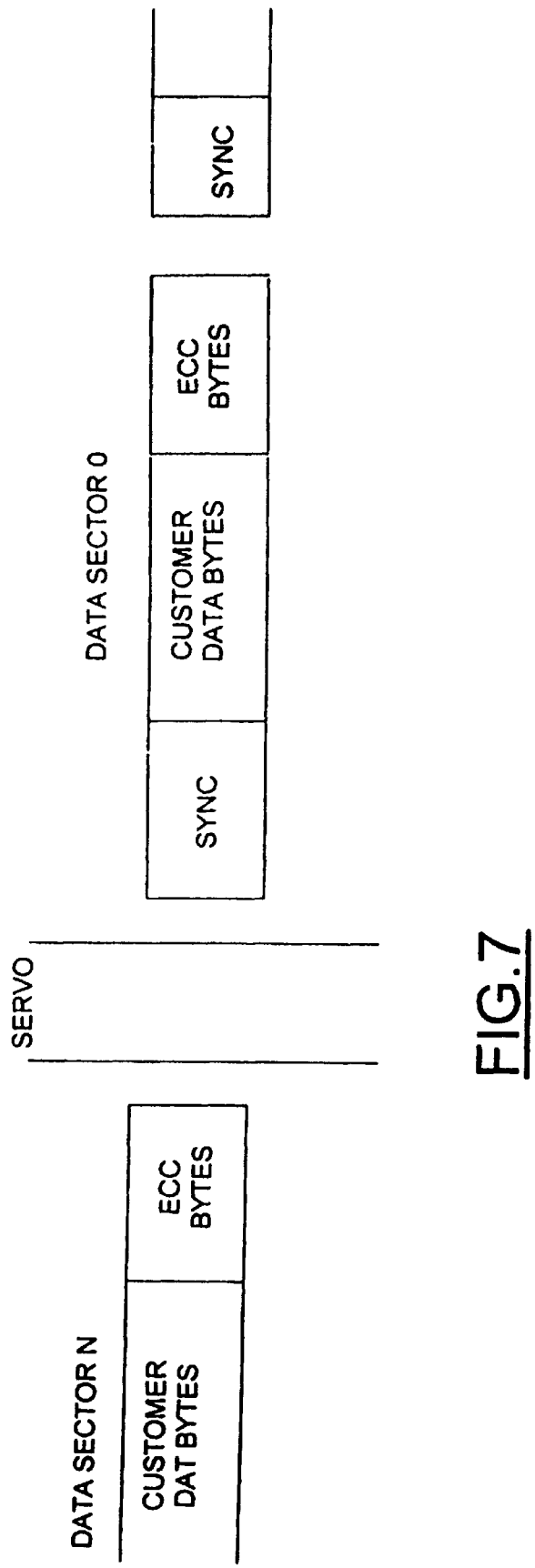
FIG. 7 is a graph illustrating an example of a track format used with the present invention.

An example of a track format in a sector servo format file is shown in FIG. 7. As shown in FIG. 7, the servo pattern includes a write-to-read recovery field (W/R) and a servo region. Each data sector 0 to n includes a synchronization field (sync) used to synchronize the read clock with the read data, a customer data field and an error correcting code (ECC) field at the end of the customer data.

Figure 3:
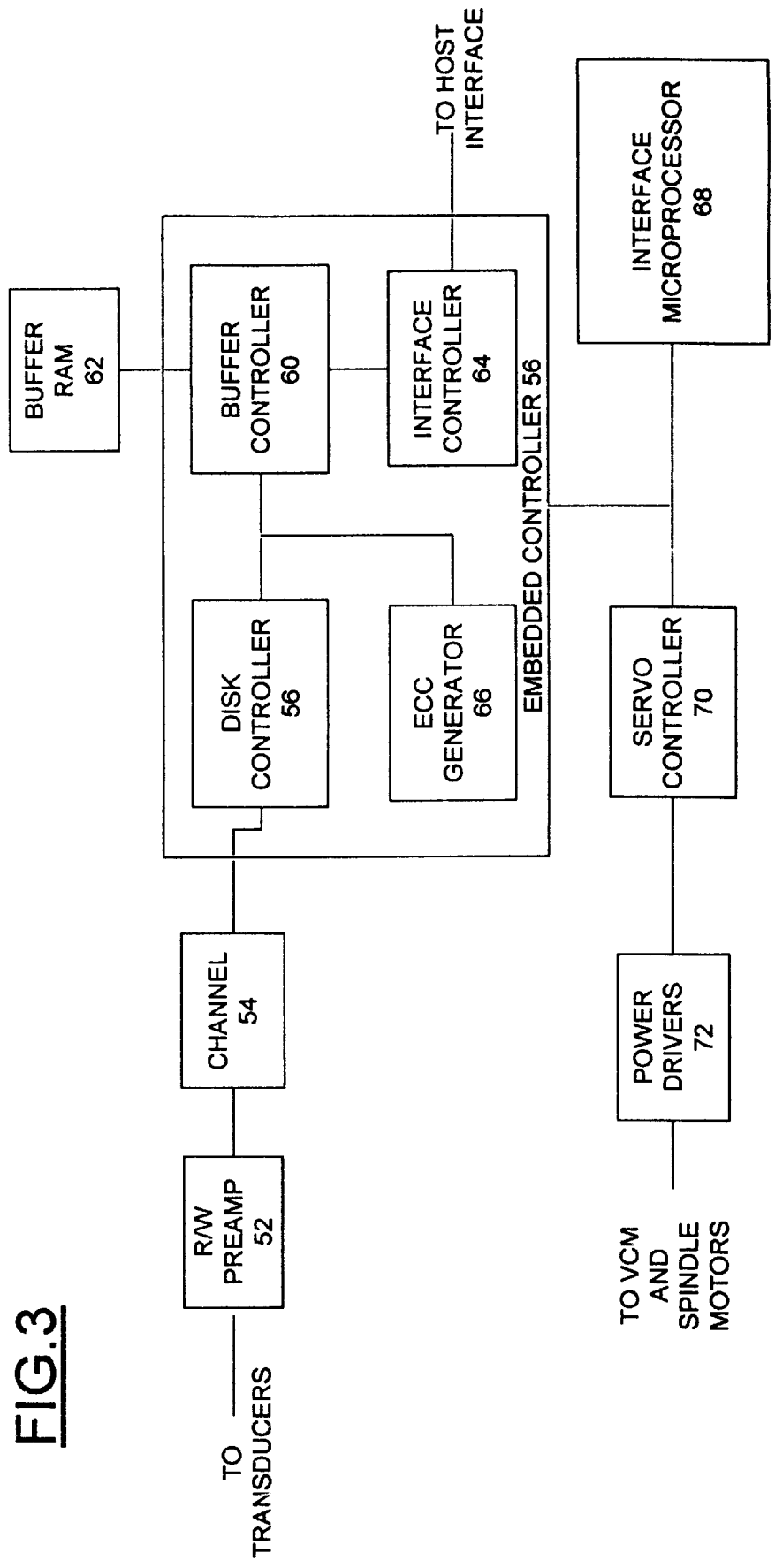
FIG. 3 is a block diagram functional representation illustrating the data storage disk file of FIG. 1.

Referring now to FIG. 3, there is shown a block diagram functional representation of the disk file 10 generally designated as 50 for carrying out the predetermined information storage with the ECC methods of the invention. Servo information and customer data are read by the R/W heads 28 and amplified by a preamplifier (preamp) 52. A data channel 54 uses known sampling techniques for detecting the readback signals from the disk that contain the customer data. An embedded controller 56 includes a disk controller 58 coupled to the data channel 54 and a buffer controller 60 that is coupled to a buffer random access memory (RAM) 62 and is coupled to a host interface via an interface controller 64. An error correcting code (ECC) syndrome generator 66 is coupled between the disk controller 58 and buffer controller 60. An interface microprocessor 70 and a servo control 70 are coupled to the embedded controller 56 performing interface processor functions. The servo control 70 performs servo control functions providing servo positioning control signals to a power drivers block 72 coupled to the VCM 39 and the spindle motor 26.

ECC generator 66, as conventionally used in disk files, provides an error detection and correction function to protect the integrity of the customer data from readback errors that are inherent in disk drives. The error detection and correction function is accomplished by appending a predefined number of data bytes of error correcting code (ECC), called syndrome (check bytes), to the end of the customer data block during a write operation. The syndrome is calculated from the customer data being written by passing the data through the ECC syndrome generator 66. The unique syndrome calculated for the block of customer data is appended to the end of that data and written on the disk. During a read operation the customer data including the appended ECC syndrome bytes being read from the disk is passed through the ECC syndrome generator 66. The ECC syndrome bytes are used to detect and correct errors in the customer data and syndrome that may have occurred during the read operation.

The power of the ECC, that is the number of bytes the ECC can protect in a single block and the number of errors the ECC can safely detect and correct, is directly related to the number of syndrome bytes recorded with the customer data block. Typically the number of bytes of customer data an ECC can protect is much larger than the actual number of bytes selected for the customer block size.

U.S. Pat. No. 4,494,234, issued Jan. 15, 1985, U.S. Pat. No. 4,525,838, issued Jun. 25, 1985, U.S. Pat. No. 4,703,485, issued Oct. 27, 1987, and U.S. Pat. No. 4,706,250, issued Nov. 10, 1987, to Arvind M. Patel and assigned to the present assignee, disclose systems and methods for correcting errors, and are hereby incorporated by reference as if fully set forth herein.

In accordance with a feature of the invention, available capability in the ECC is utilized to store predetermined information about a sector without requiring the use of additional disk storage space. The predetermined information generally is used to protect the customer data including either the physical address, head, cylinder and sector numbers or a logical block address. Both of these numbers are determined and available before writing or reading customer data to a particular address on the disk. The available ECC function on the disk file 10 is used to store predetermined information before both a write operation and a read operation for the purpose of verifying the predetermined information on the read operation, to avoid otherwise undetected possible data errors.

In accordance with the invention, predetermined information known in advance of both read and write operations, is pre-loaded to the ECC syndrome generator 66 before customer data is written and read. During the write operation as illustrated and described with respect to FIG. 5, the predetermined information data is run through the ECC generator 66 but not actually written to the disk. The ECC syndrome (check bytes) appended to the customer data and written to the disk include hidden bytes related to the pre-loaded predetermined information or reflects the fact that the pre-loaded data was run through the ECC generator. On a subsequent read operation as illustrated and described with respect to FIG. 4, again pre-loading of the ECC generator 66 with the predetermined information for the particular data block causes one of two conditions to occur.

Firstly and most likely, the data pre-loaded on the read operation will match the pre-loaded data from the write operation. Typically the ECC generator 66 will detect the same information on these first bytes and will flag no errors in the pre-loaded area.

Secondly, when the pre-loaded read data does not match what was pre-loaded during the write operation, the block's syndrome will detect that the pre-loaded predetermined data does not match even though the pre-loaded predetermined data was never written to the disk. During this error condition, the ECC generator 66 performs an error recovery sequence as illustrated and described with respect to FIG. 6.

In accordance with a feature of the invention, the power of the ECC is shared for storing other predetermined information with minimal impact on the normal data error detection and correction capability. Since the full power of the code is seldom used, then sharing the power to protect other aspects has little impact on the original function of the ECC, and saves bytes of redundancy in otherwise used systems. The only technical cost of saving hidden bytes of predetermined information with ECC is a change in the maximum length of customer data in a sector that can be corrected by the ECC. For example, with a maximum of 747 customer data bytes allowed in a sector, the use of hidden data can reduce the maximum number of customer data bytes by the number of hidden bytes; however, for example, only one byte of hidden data may be required for the desired predetermined information. Typically customers use the standard 512 data bytes, or 520 or 528 data bytes so that there are normally over 200 unused bytes within the ECC coverage capability.

The customer data and syndrome (check bytes) are protected by the ECC with an insignificant change in the probability of miss-detection or miss-correction resulting from the additional predetermined information pre-loaded to the ECC. By pre-loading the ECC syndrome generator with predetermined information including other selected system parameters, it is possible to detect errors while reading if other system parameters are not correctly set. For example, the predetermined information can be used to verify that the servo system is reporting the correct sector number for the data being read. Pre-loading the predetermined information with ECC generation advantageously is used with the No-ID servo format, servo formats including identification fields and servo formats with reduced number of identification fields. As another example, if three bytes of system parameters are not known during a read, that were used in the generation of written ECC syndrome (check bytes), then by loading any other data into these three bytes before a read operation will cause the ECC generator 66 to provide on the fly corrections to generate the correct values of these bytes, when the customer data does not have an error. If there is a data error in the sector, then the next sector would give the information.

Pre-loading the ECC syndrome generator with predetermined information can be used for linking several blocks of data. The amount of data that can be covered by a given error detecting code is limited. If larger blocks of data are desired, several blocks can be linked together by pre-loading the syndrome of one block into the syndrome generator of the next block. Using this technique, it is possible to detect if a block read did not belong to the series of blocks being linked. This application of the pre-loading predetermined information to the ECC generator provides protection for logical blocks that are composed of multiple physical blocks, and provides a check that all the physical blocks were updated on the write.

Figure 4:
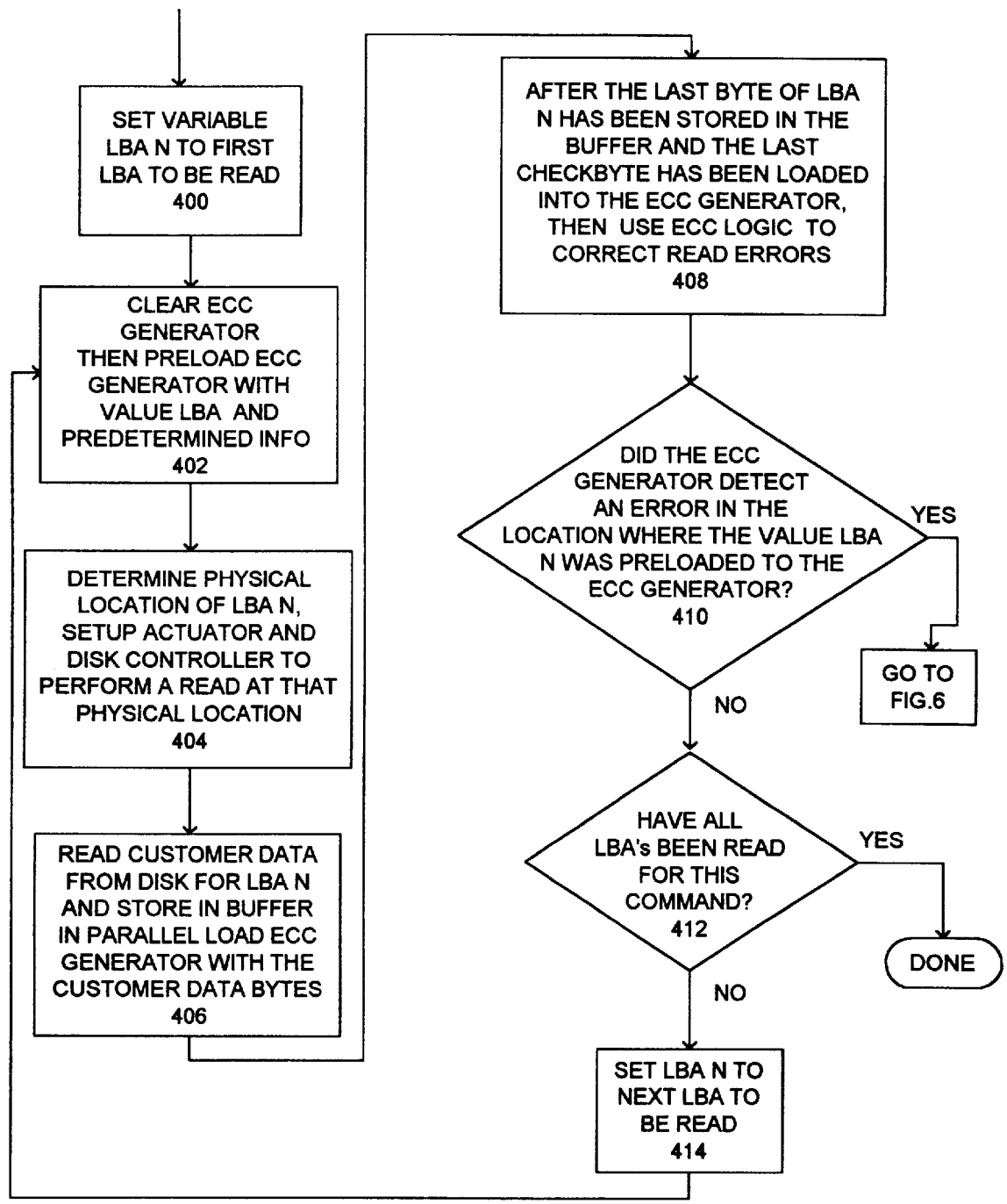
FIGS. 4, 5 and 6 are flow charts illustrating the predetermined information reading, writing and data recovery methods and apparatus of the invention.

Referring to FIG. 4, there is shown a flow chart illustrating sequential steps for reading customer data including predetermined information stored with the ECC in accordance with the invention. Initially, the predetermined information including a variable logical block address (LBA) is set to a first LBA to be read as indicated at a block 400. Then the ECC generator 66 is cleared and pre-loaded with the predetermined information and the value LBA as indicated at a block 402. Next the physical location of the LBA is determined and the actuator and disk controller 58 is setup to perform a read at that physical location as indicated at a block 404. Customer data from disk for the LBA are read and stored in the buffer RAM 62 and in parallel the customer data bytes are loaded to the ECC generator 66 as indicated at a block 406.

After the last byte of the LBA has been stored in the buffer RAM 62 and the last checkbyte has been loaded into the ECC generator 66, the ECC logic is used to detect and correct read errors as indicated at a block 408. Next it is determined whether the ECC generator detected an error in the location where the value LBA was pre-loaded to the ECC generator as indicated at a decision block 410. When an error in the location for the pre-loaded predetermined information and LBA N is detected at block 410, then the sequential operations continue with the error recovery sequence in FIG. 6. Otherwise, when such an error is not detected, then it is determined whether all LBAs have been read for this command as indicated at a decision block 412. If all LBAs have not been read, then the LBA N is set to the to next LBA to be read as indicated at a block 414 and the sequential steps return to block 402. Otherwise when determined that all LBAs have been read, then the read operation is completed.

Figure 5:
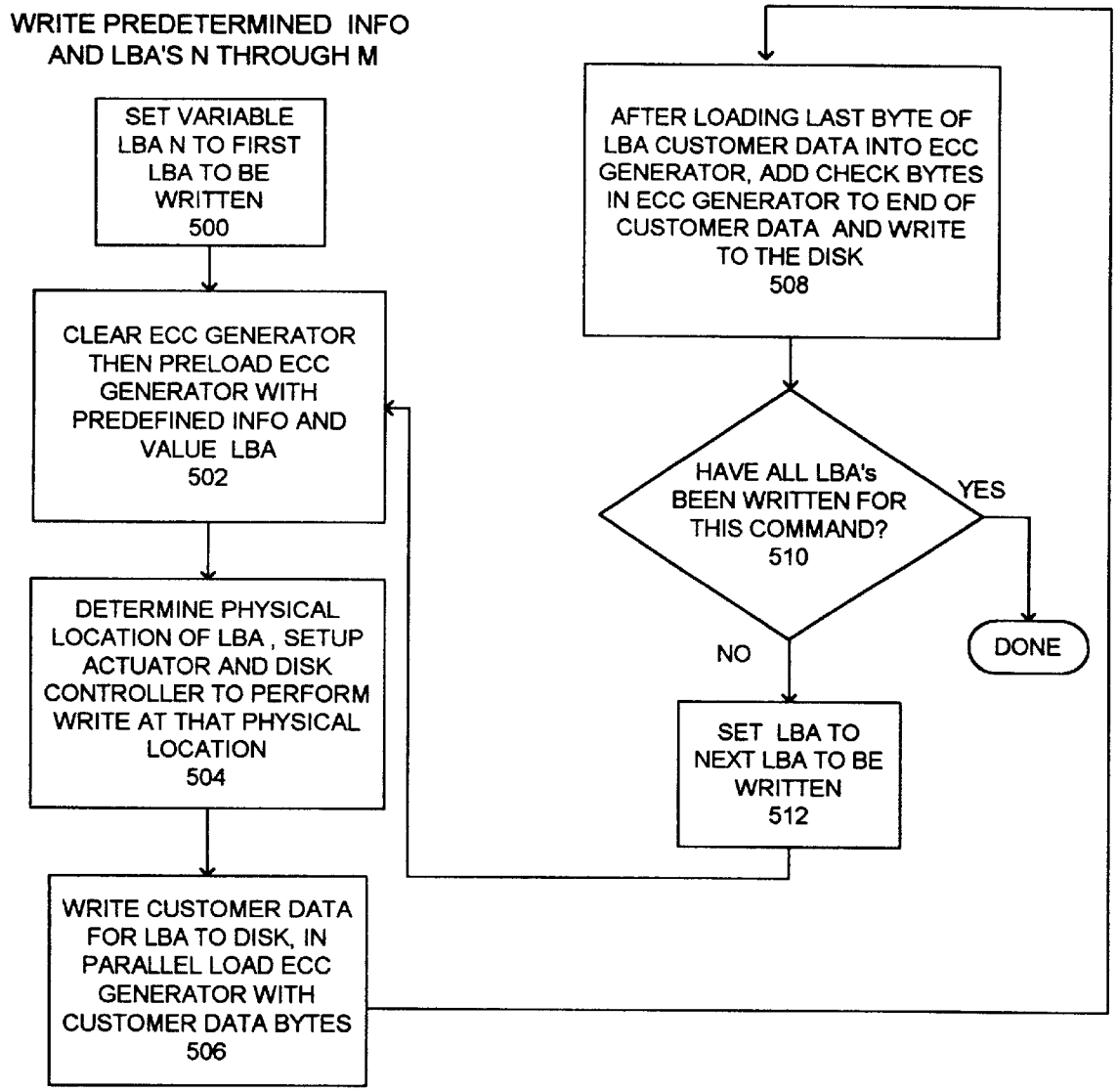

Referring to FIG. 5, there is shown a flow chart illustrating sequential steps for writing customer data including predetermined information stored with the ECC in accordance with the invention. Initially, the variable LBA N is set to first LBA to be written as indicated at a block 500. Then the ECC generator 66 is cleared and pre-loaded with the predetermined information and the value LBA as indicated at a block 502. Next the physical location of LBA is determined and the actuator and disk controller 58 is setup to perform a write at that physical location as indicated at a block 504. Customer data from disk for the LBA are written and in parallel the customer data bytes are loaded to the ECC generator 66 as indicated at a block 506.

After loading the last byte of LBA customer data into ECC generator, checkbytes in ECC generator are added to end of customer data and written to the disk as indicated at a block 508. Next it is determined whether all LBAs have been written for this command as indicated at a block 510. When LBAs are remaining to be written for this command, then the current LBA is set to next LBA to be written as indicated at a block 512. Then the sequential steps continue returning to block 502. Otherwise, when determined that all LBAs have been written; then the write operation is completed.

Figure 6:
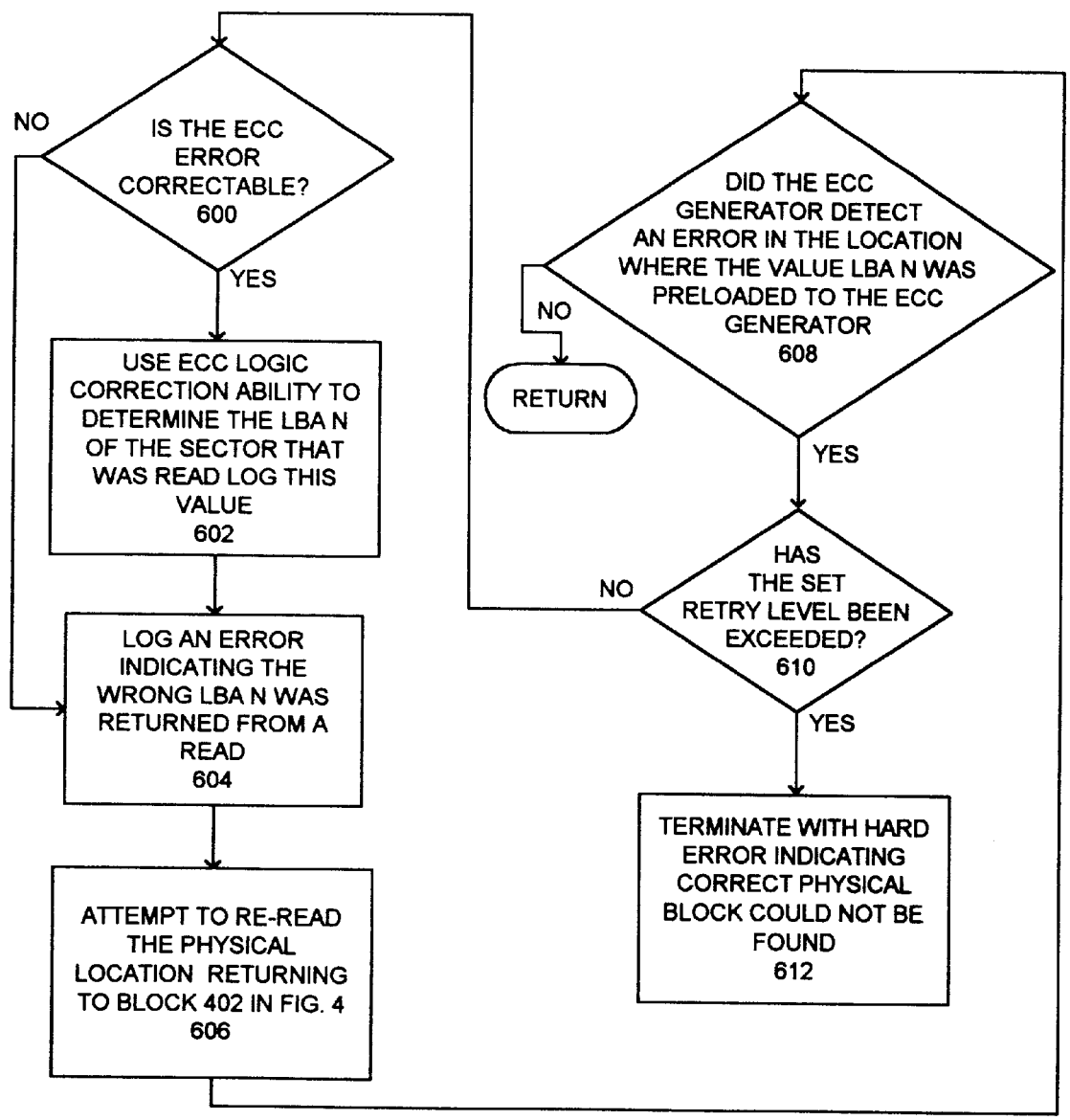

Referring now to FIG. 6, the sequential steps for error recovery are illustrated. First, it is determined if the ECC error detected at decision block 410 in FIG. 4, is correctable as indicated at a decision block 600. If determined that the ECC error is correctable, then the ECC generator 66 is used to determine the actual LBA of the sector that was read and the identified value is stored as indicated at a block 602. Otherwise, when determined that the ECC error is not correctable at block 600 and after the actual LBA is stored at block 602, then an error is stored indicating the wrong LBA N was returned from a read as indicated at a block 604. Then re-reading of the desired physical location is attempted as indicated at a block 606 by repeating steps 402, 404, 406 and 408 in FIG. 4.

Next it is determined if the ECC generator detected an error in the location where the value LBA N was pre-loaded to the ECC generator as indicated at a decision block 608.

When determined that the ECC generator detected an error in the location where the value LBA N was pre-loaded to the ECC generator, then it is determined whether the predetermined retry level has been exceeded as indicated at a decision block 610. When determined that the ECC generator did not detect an error in the location where the value LBA N was pre-loaded to the ECC generator, then the sequential operations return to block 410 in FIG. 4. If the predetermined retry level has not been exceeded, then the sequential steps are repeated, returning to the decision block 600. Otherwise, when the predetermined retry level has been exceeded, then the sequential steps conclude with the generation of a terminate command with hard error indicating correct physical block could not be found as indicated at a block 612.

While the present invention has been described with reference to the details of the embodiments of the invention shown in the drawing, these details are not intended to limit the scope of the invention as claimed in the appended claims.

What is claimed is:

1. A method for storing predefined information with error correcting code (ECC) in a direct access storage device (DASD), said DASD including at least one disk surface for storing data and an embedded controller including a disk controller coupled to a data channel, a buffer controller coupled to a buffer memory, an error correcting code (ECC) generator coupled to the disk controller and the buffer controller, and an interface controller coupled to a host interface, and the embedded controller coupled to a servo controller, the servo controller performing servo control functions, said method performed by the embedded controller comprising the steps of:

identifying predetermined information, said identified predetermined information consisting of information not stored on said disk surface;

loading said identified predetermined information to an ECC generator for both customer data to be read from and written to said disk surface;

writing said customer data on said disk surface; and loading in parallel said written customer data to said ECC generator;

writing ECC generated from said predetermined information and said written customer data at the end of said written customer data on said disk surface; and reading said customer data and ECC from said disk surface; and loading in parallel said read customer data and ECC to said ECC generator.

2. A method as recited in claim 1 wherein said step of identifying predetermined information includes the step of:

identifying an address for both customer data to be read from and written to said disk surface.

3. A method as recited in claim 2 wherein said step of identifying predetermined information includes the step of:

identifying a logical block address (LBA) of the customer data to be read from and written to said disk surface.

4. A method as recited in claim 2 wherein said step of identifying predetermined information includes the step of:

identifying a physical address of the customer data to be read from and written to said disk surface.

5. A method as recited in claim 1 further includes the step of utilizing said read ECC to detect an error in said predetermined information and including said address of the customer data read.

6. Apparatus for storing predefined information with error correcting code (ECC) in a direct access storage device (DASD), said DASD including at least one disk surface for storing data, and an embedded controller including a disk controller coupled to a data channel, a buffer controller coupled to a buffer memory, an error correcting code (ECC) generator coupled to the disk controller and the buffer controller, and an interface controller coupled to a host interface, and the embedded controller coupled to a servo controller, the servo controller performing servo control functions, said apparatus provided by the embedded controller comprising:

means for identifying predetermined information, said identified predetermined information consisting of information not stored on said disk surface;

an ECC generator coupled to said predetermined information identifying means, said ECC generator receiving said identified predetermined information for both customer data to be read from and written to said disk surface;

means for writing customer data to said disk surface and f loading in parallel written customer data to said ECC generator means for writing ECC generated from said predetermined information and said written customer data at the end of said written customer data on said disk surface; and means for reading said customer data and ECC from said disk surface and loading in parallel said read customer data and ECC to said ECC generator.

7. Apparatus as recited in claim 6 wherein said means for identifying said identified predetermined information includes means for identifying an address for both customer data to be read from and written to said disk surface.

8. Apparatus as recited in claim 7 further including means for utilizing said read ECC to detect an error in said predetermined information and including said address of the read customer data.

9. Apparatus as recited in claim 8 wherein said utilizing means further includes means for identifying an actual address of the read customer data.

10. Apparatus as recited in claim 8 further includes means for re-reading said customer data and ECC responsive to a detected error in said address.

11. A direct access storage device comprising:

at least one disk mounted in said housing for rotation about an axis and having at least one disk surface for storing data;

transducer means mounted for movement across said disk surface for reading and writing data to said disk surface;

an embedded controller including a disk controller coupled to a data channel, a buffer controller coupled to a buffer memory, an error correcting code (ECC) generator coupled to the disk controller and the buffer controller, and an interface controller coupled to a host interface, the embedded controller coupled to a servo controller, the servo controller performing servo control functions, said embedded controller including means for identifying predetermined information; said identified predetermined information consisting of information not stored on said disk surface;

said embedded controller including said ECC generator coupled to said predetermined information identifying means, ECC generator receiving said identified predetermined information for both customer data to be read from and written to said disk surface;

said embedded controller including means for writing customer data on said disk surface, and for loading in parallel written customer data to said ECC generator;

said embedded controller including means for writing ECC generated from said predetermined information and said written customer data at the end of said written customer data on said disk surface;

said embedded controller including means for reading said customer data and ECC from said disk surface, and loading in, parallel said read customer data and ECC to said ECC generator; and said embedded controller including means for utilizing said read ECC to detect an error in said predetermined information of the read customer data.

12. A direct access storage device as recited in claim 11 wherein said means for identifying said identified predetermined information includes means for identifying an address for both customer data to be read from and written to said disk surface.

* * * * *

UNITED STATES PATENT AND TRADEMARK OFFICE
CERTIFICATE OF CORRECTION

PATENT NO. : 6,079,044
DATED : Jun. 20, 2000
INVENTOR(S) : Earl Albert Cunningham; Richard Greenberg; Michael J. Shea It is certified that an error appears in the above-identified patent and that said Letters Patent is hereby corrected as shown below:

```
Column 8, Line 22 replace "floading" with --for loading--.
Column 8, Line 23 after "generator" insert --;--.
```

Signed and Sealed this

Fifteenth Day of May, 2001

Attest:

NICHOLAS P. GODICI

*Attesting Officer*     *Acting Director of the United States Patent and Trademark Office*